US007119529B2

(12) United States Patent
Kadner

(10) Patent No.: US 7,119,529 B2
(45) Date of Patent: Oct. 10, 2006

(54) CIRCUIT ARRANGEMENT WITH A RESISTOR VOLTAGE DIVIDER CHAIN

(75) Inventor: Martin Kadner, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 251 days.

(21) Appl. No.: 10/865,695

(22) Filed: Jun. 9, 2004

(65) Prior Publication Data

US 2005/0012495 A1 Jan. 20, 2005

(51) Int. Cl.
*H03H 1/00* (2006.01)
*H01L 39/00* (2006.01)

(52) U.S. Cl. ....................................... 323/367; 323/364

(58) Field of Classification Search ................ 363/364, 363/365, 367; 341/158, 159, 161, 162; 323/364, 323/365, 367
See application file for complete search history.

(56) References Cited

U.S. PATENT DOCUMENTS 6,002,356 A * 12/1999 Cooper ....................... 341/160
6,118,295 A * 9/2000 Murayama et al. ......... 324/771
6,480,134 B1 * 11/2002 Sasaki ......................... 341/159
6,686,863 B1 * 2/2004 Jaussi et al. ................ 341/158
6,741,199 B1 * 5/2004 Gartner et al. .............. 341/158

* cited by examiner

*Primary Examiner*—Matthew V. Nguyen
(74) *Attorney, Agent, or Firm*—Adam L. Stroud

(57) ABSTRACT

A description is given of a circuit arrangement with a resistor voltage divider chain which comprises a number N of two-terminal resistors which are connected in series between a number N+1 of connection points, with N being greater than or equal to 2. In order to monitor the operating state of the resistor voltage divider chain, there is proposed an arrangement having at least two comparator stages with in each case two input terminals, each of which is connected to in each case one of the connection points such that each of the resistor elements is bridged by the input terminals of at most one of the comparator stages, and with in each case one output terminal for outputting a comparator output signal having a first logic level when corresponding signals are fed to the input terminals and otherwise having a second logic level, and a switching stage which has in each case one input terminal for connection to each of the output terminals of the comparator stages and is designed to form an error signal by logic switching of the comparator output signals in order to indicate an error when at least one of the comparator output signals has a first logic level.

7 Claims, 2 Drawing Sheets

CIRCUIT ARRANGEMENT WITH A RESISTOR VOLTAGE DIVIDER CHAIN

The invention relates to a circuit arrangement with a resistor voltage divider chain which comprises a number N of two-terminal resistors which are connected in series between a number N+1 of connection points, with N being greater than or equal to 2.

Resistor voltage divider chains are known per se and are often used in electrical and electronic circuit technology.

When using such a resistor voltage divider chain, it may be desirable to monitor the operating state of this resistor voltage divider chain. It may be particularly useful to monitor whether and possibly where such a resistor voltage divider chain has been broken.

It is an object of the invention to provide a resistor voltage divider chain having an arrangement for monitoring the operating state of this resistor voltage divider chain.

According to the invention, this object is achieved in a circuit arrangement of the generic type by an arrangement for monitoring the operating state having at least two comparator stages with in each case two input terminals, each of which is connected to in each case one of the connection points such that each of the resistor elements is bridged by the input terminals of at most one of the comparator stages, and with in each case one output terminal for outputting a comparator output signal having a first logic level when corresponding signals are fed to the input terminals and otherwise having a second logic level, and a switching stage which has in each case one input terminal for connection to each of the output terminals of the comparator stages and is designed to form an error signal by logic switching of the comparator output signals in order to indicate an error when at least one of the comparator output signals has a first logic level. The switching stage thus has a number of input terminals, and in each case one of the comparator stages is connected by its output terminal to in each case a specific one of these input terminals of the switching stage. If only one of the comparator output signals has a first logic level, an error signal indicating an error is output by the switching stage.

The invention is based on the recognition that, at two connection points of a broken resistor voltage divider chain, signals, particularly electrical voltage potentials, occur which in the ideal case totally and in practice at least largely—on account of interference, etc.—correspond with one another provided that the relevant connection points are located only on the same side of the break in the resistor voltage divider chain. By means of the circuit arrangement according to the invention, the signals at at least three connection points are compared with one another in pairs. Since each of the two input terminals of each comparator stage is connected to in each case one of the connection points of the resistor voltage divider chain such that each of the resistor elements is bridged by the input terminals of at most one of the comparator stages, the input terminals of at most one of these comparators can be located on different sides of the break in the resistor voltage divider chain; at least in respect of one of the comparator stages, the connection points are located only on the same side of the break in the resistor voltage divider chain. Therefore, in the case of a break in the resistor voltage divider chain, at least one of the two comparator stages will receive at its input terminals at least largely corresponding signals and therefore output a comparator output signal having a first logic level.

By virtue of the circuit arrangement according to the invention, a check is in this way reliably made as to whether the resistor voltage divider chain is broken. As long as there is no break, corresponding comparator output signals having the second logic level are output by all comparator stages, since during operation of the resistor voltage divider chain in each case different signals, are fed to the input terminals of all comparator stages, said signals preferably corresponding to a voltage difference brought about by a flow of current in the resistor voltage divider chain. Thus, in this operating state, no error is indicated by the switching stage.

If, on the other hand, the resistor voltage divider chain is broken, at least one of the comparator stage supplies a comparator output signal having a first logic level, since the input terminals of at least this one comparator stage are in each case fed corresponding signals. This is detected by the switching stage, recognized as an error and indicated or reported by an appropriate error signal.

In order to ensure reliable functioning of the circuit arrangement according to the invention, the comparator stages are advantageously designed with a so-called offset. By virtue of this offset, the switching point of the comparator stages is offset slightly to positive values of the difference in the signals fed to their input terminals. The extent of this offset is adapted to the noise and interference levels which occur in the circuit arrangement and also to the value of the difference in the signals which are fed to the input terminals in the case of error-free operation of the resistor voltage divider chain, such that noise and interference signals do not adversely affect the switching of the comparator stages but the signals are easily detected in the case of error-free operation of the resistor voltage divider chain.

The switching stage preferably comprises an AND gate. The formation of the error signal with the desired behavior when only one comparator output signal having a first logic level occurs is thus possible in a simple manner.

In a further aspect of the invention, the switching stage is designed to output a signal which contains information about which of the comparator output signals assume(s) the first or the second logic level. A switching stage designed in this way may be obtained in a simple manner in that the logic operations carried out therein are formed as in the case of a 1-of-n decoder, only with the input and output variables being swapped over. It should be pointed out that a 1-of-n decoder of the abovementioned type is known from the monograph "Halbleiter-Schaltungstechnik [Semiconductor circuit technology]" by U. Tietze and Ch. Schenk, 8th edition, 1986, Springer Verlag, Section 9.6.1, page 223. In addition, the switching stage may furthermore output the above-described error signal in order thereby to indicate whether an error is occurring. In the event of an error, therefore, it is possible not only to indicate that a break in the resistor voltage divider chain has occurred but also to locate the error.

At this point it should be pointed out that there is known, from the monograph "Halbleiter-Schaltungstechnik [Semiconductor circuit technology]" by U. Tietze and Ch. Schenk, 8th edition, 1986, Springer Verlag, Section 8.5.1, page 180, a window comparator which comprises two comparators, the outputs of which are linked to one another via an AND gate. A first comparison voltage $U_1$ is fed to an inverting input of a first of these comparators, a second comparison voltage $U_2$ is fed to a non-inverting input of a second of these comparators and an input voltage $U_e$ is fed to a connection of an inverting input of the second comparator with a non-inverting input of the first comparator. It is thus possible to ascertain whether the input voltage is within the range between the comparison voltages or out with said range.

The invention will be further described with reference to examples of embodiments shown in the drawings to which, however, the invention is not restricted.

Figure 1:
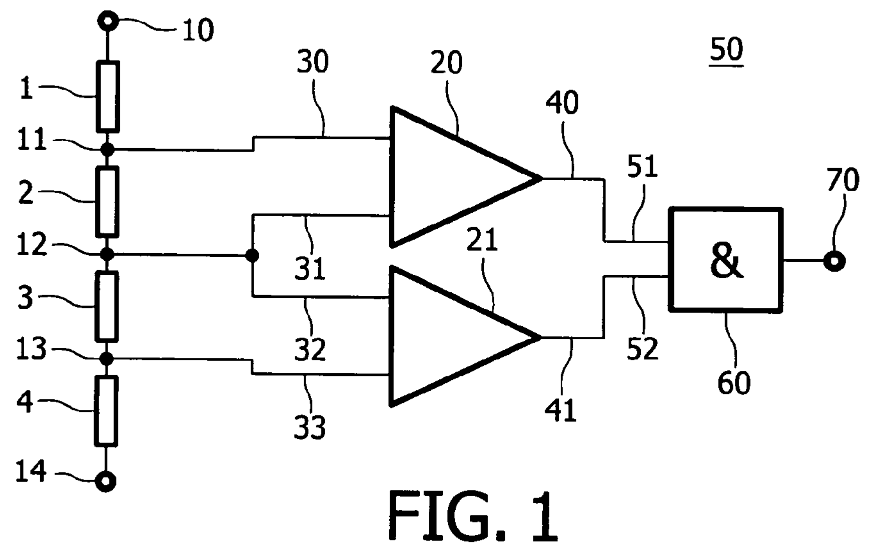
FIG. 1 shows a block diagram of a first example of embodiment of a circuit arrangement according to the invention.

FIG. 1 shows a first simple example of embodiment of a circuit arrangement according to the invention. Said circuit arrangement comprises a resistor voltage divider chain consisting of a first, second, third and fourth two-terminal resistor 1, 2, 3 and 4. The latter are connected in series with one another by their terminals via connection points 10, 11, 12, 13 and 14, the first of these connection points referenced 10 forming a first end terminal and the last of these connection points referenced 14 forming a second end terminal of the resistor voltage divider chain. A first and a second comparator stage 20, 21 and also a switching stage 50, which in this case is formed by an AND gate 60, together form an arrangement for monitoring the operating state of the resistor voltage divider chain. For this purpose, a first input terminal 30 of the first comparator stage 20 is connected to the second connection point 11 and a second input terminal 33 of the second comparator stage 21 is connected to the fourth connection point 13. A second input terminal 31 of the first comparator stage 20 and a first input terminal 32 of the second comparator stage 21 are together connected to the third connection point 12. An output terminal 40 of the first comparator stage 20 is connected to a first input terminal 51 of the switching stage 50 and an output terminal 41 of the second comparator stage 21 is connected to a second input terminal 52 of the switching stage 50. An error signal for indicating an error—generated in the resistor voltage divider chain by logic switching of the comparator output signals—can be output at the output terminal 70 of the AND gate 60 and thus in this case of the switching stage 50.

When the resistor voltage divider chain is in determined, error-free operation, a current flows through the series circuit of the two-terminal resistors 1 to 4 from the first connection point 10 to the fifth connection point 14, and a voltage, i.e. a potential difference, forms at each of the two-terminal resistors 1 to 4. By virtue of this potential difference, which is greater than an offset by which the influence of noise and interference levels which occur in the circuit arrangement is suppressed, the first and second comparator stages 20, 21 are activated in a corresponding manner to output a comparator output signal having a second logic level at their output terminals 40 and 41. In the present example, the second logic level corresponds to a logic “1”. A logic “1” is thus also output at the output terminal 70 of the AND gate 60, this indicating error-free operation.

If, on the other hand, the resistor voltage divider chain is broken at any point between the first connection point 10 and the fifth connection point 14, by virtue of this measure the aforementioned current is stopped and the voltage forming at the two-terminal resistors 1 to 4 breaks down. It assumes, apart from influences on account of noise and interference levels, the value zero and is thus in any case smaller than the aforementioned offset. The first and second comparator stages 20, 21 are thus activated in a corresponding manner to output a comparator output signal having a first logic level at their output terminals 40 and 41. In the present example, the first logic level corresponds to a logic “0”. A logic “0” is thus also output at the output terminal 70 of the AND gate 60, this indicating that there is an error.

Figure 2:
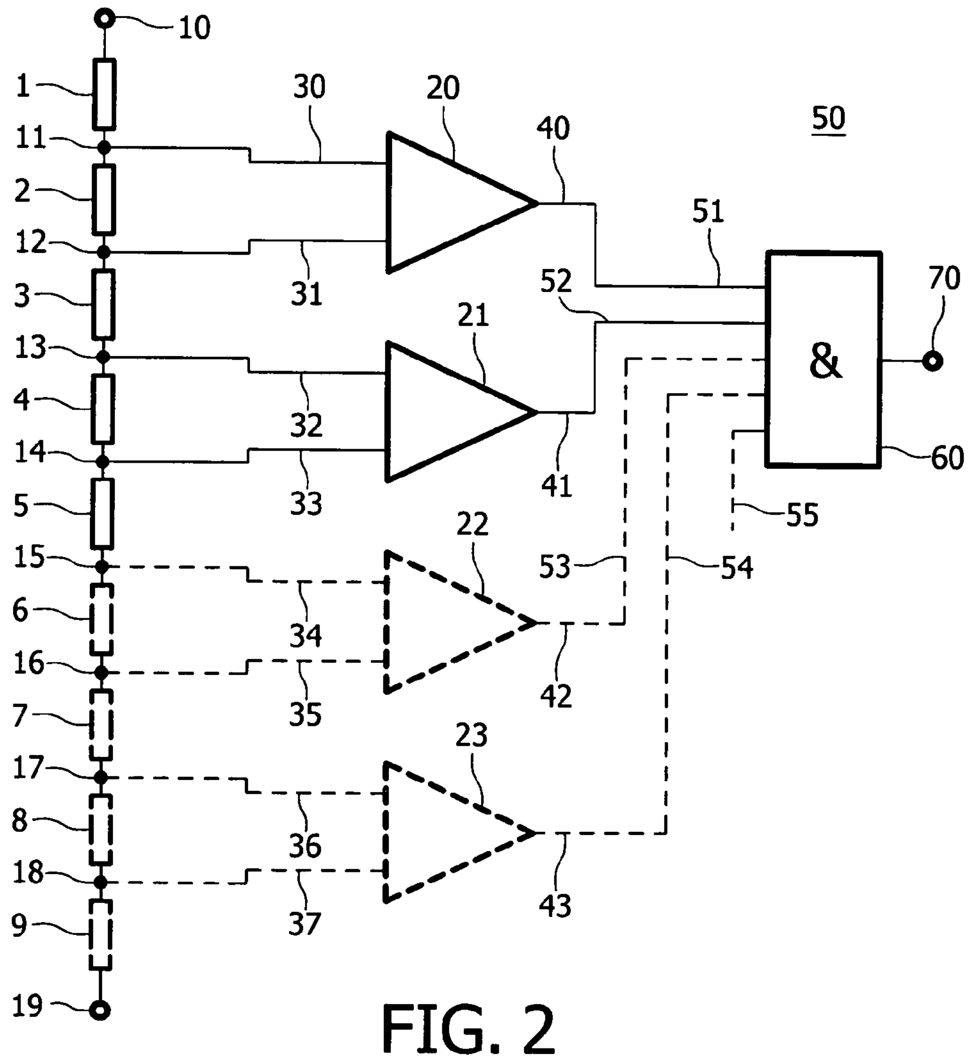
FIG. 2 shows a block diagram of a second example of embodiment of a circuit arrangement according to the invention.

In the second example of embodiment shown in FIG. 2, the resistor voltage divider chain is expanded by a fifth two-terminal resistor compared to the arrangement shown in FIG. 1. Furthermore, an additional possibility for expanding the arrangement according to the invention by in principle any number of two-terminal resistors is shown by dashes in the lines used in the drawing shown in FIG. 2; in this case, sixth to ninth two-terminal resistors 6 to 9 are shown. Correspondingly, sixth to tenth connection points 15 to 19 for connecting the two-terminal resistors 5 to 9 are or may be provided. In order to detect potential differences at at least some of the additional two-terminal resistors, a possibility of also expanding the number of comparator stages is provided. In this case, a third and a fourth comparator stage 22, 23 with input terminals 34, 35 and 36, 37 and output terminals 42 and 43 are shown; further comparator stages are possible.

Unlike in FIG. 1, in the arrangement shown in FIG. 2 each of the input terminals 30 to 37 is connected to a specific one of the second to fifth connection points 11 to 14, and where appropriate of the sixth to ninth connection points 15 to 18. The first and a tenth connection point 10 and 19 now form the first and a second end terminal of the resistor voltage divider chain. Depending on the number of comparator stages 20, 21 and where appropriate 22, 23 that are used, the AND gate 60 is equipped with further input terminals 53, 54 which are shown here in dashed line. An additional expansion possibility is shown by a fifth input terminal 55 which is likewise shown in dashed line.

This example of embodiment of the circuit arrangement according to the invention may still supply a reliable error signal even if, once the resistor voltage divider chain has been broken, one of its two parts is fed with a—for example externally supplied—voltage. By way of example, in FIG. 2 the resistor voltage divider chain is broken in the region of the third two-terminal resistor 3 and as an alternative an external voltage is applied to the part of the resistor voltage divider chain between the first and the third connection points 10 and 12, said part being formed of the first and second two-terminal resistors 1, 2. Since the second two-terminal resistor 2 still carries a current, the first comparator stage 20 is activated in an unchanged manner to output a comparator output signal having a second logic level at its output terminal 40. Since, however, the remaining part of the resistor voltage divider chain, formed by the fourth and fifth and also where appropriate the further two-terminal resistors 4, 5 and possibly 6 to 9, is without current, comparator output signals having a first logic level are output by the second and where appropriate the further comparator stages 21 and possibly 22, 23 at their output terminals. A logic “0” is thus produced at the output terminal 70 of the AND gate 60, whereby it is now also indicated that there is an error.

Figure 3:
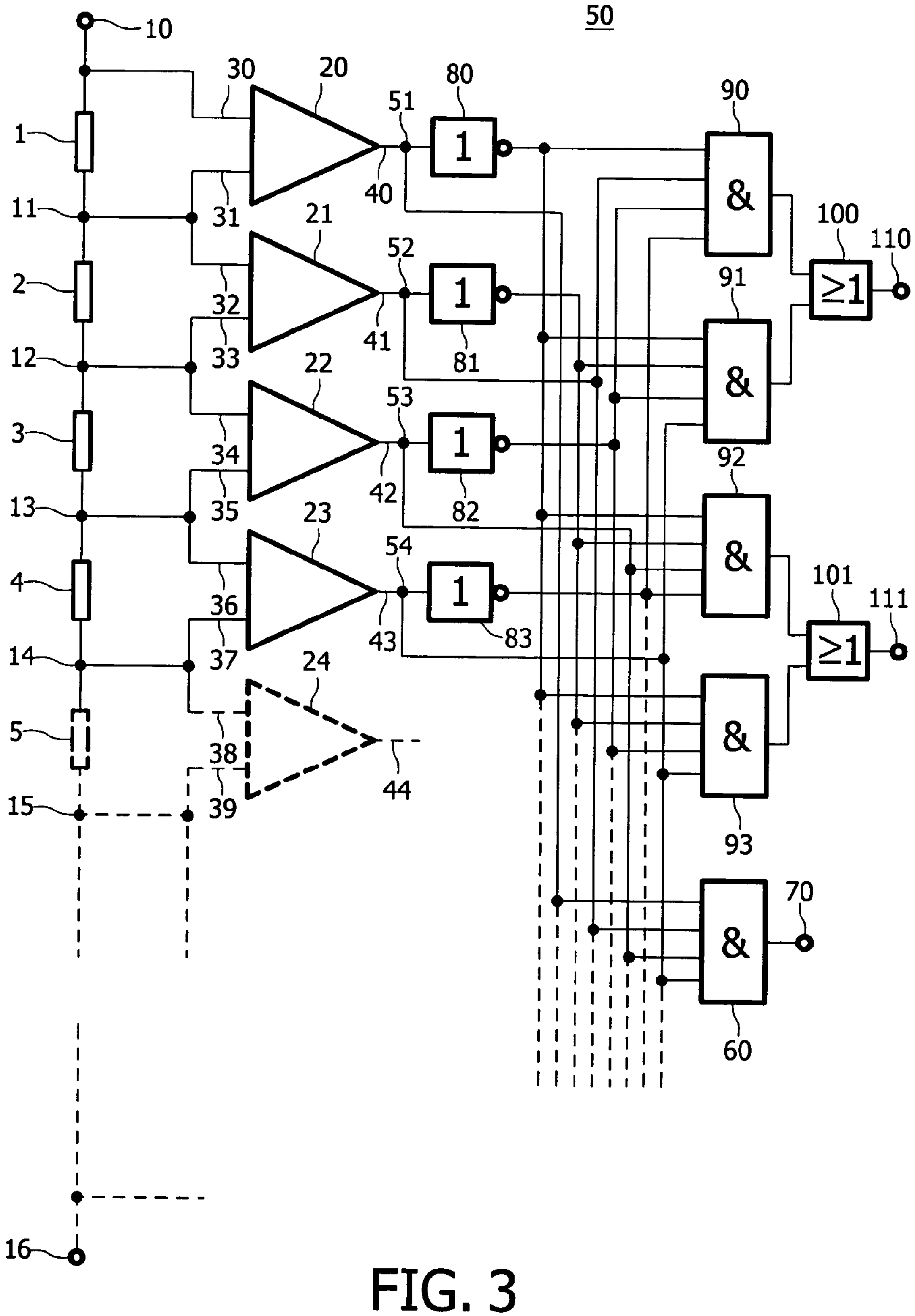
FIG. 3 shows a block diagram of a third example of embodiment of a circuit arrangement according to the invention.

FIG. 3 shows a third example of embodiment comprising a switching stage 50 which is designed, apart from to form an error signal at the output 70 of the AND gate 60, also to output a signal which contains information about which of the comparator output signals assume(s) the first or the second logic level.

For this purpose, as shown in FIG. 1, the second to penultimate connection point 11 to 13 is in each case connected to the second input terminal 31, 33 or 35 of in each case one of the comparator stages 20, 21 or 22 and to the first input terminal 32, 34 or 36 of the comparator stage 21, 22 or 23 following the relevant comparator stage 20, 21 or 22. The first connection point 10 is connected solely to the first input terminal 30 of the first comparator stage 20, and the last connection point 14 is connected to the second input terminal 37 of the fourth comparator stage 23. The end points of the resistor voltage divider chain are in this case formed by the connection points 10 and 16, the connection point 16 being connected directly, or in a possible expansion of the arrangement via at least one further two-terminal resistor 5 shown in dashed line, to the connection point 14.

Furthermore, the switching stage 50 comprises additional switching elements for the logic switching of the comparator output signals at the output terminals 40 to 43 of the comparator stages 20 to 23. In FIG. 3, these additional switching elements consist of a first to fourth inverter stage 80 to 83, to the inputs of which the comparator output signals are fed from the output terminals 40 to 43 of the comparator stages 20 to 23, and which inverter stages supply at their outputs the inverted comparator output signals. The switching stage 50 furthermore comprises AND gates 90 to 93, the number of which corresponds to the number of comparator stages 20 to 23 used and hence to the number of comparator output signals supplied by the latter. If $2^x$ is the number of comparator output signals and hence of the output terminals 40 to 43 of the comparator stages 20 to 23, the number of AND gates 90 to 93 is defined as $2^x$. The information, supplied by the comparator output signals, indicating at which of the two-terminal resistors 1 to 4 and hence at which of the comparator stages 20 to 23 faulty operation occurs can thus be output at output terminals 110, 111, provided for this purpose, as an m-digit binary signal, where m is the next-greatest integer after x.

Each of the AND gates 90 to 93 has a number of inputs which corresponds to the number of comparator stages 20 to 23 used; in FIG. 3 there are in each case four inputs. Each of these inputs is connected to a selected output terminal 40, 41, 42 or 43 of the comparator stages 20 to 23 and to the output of a selected inverter stage 80, 81, 82 or 83. As a result, in the AND gates 90 to 93, signals are formed by AND operations in accordance with the following rules:

$$A90=\hat{A}40*A41*\hat{A}42*\hat{A}43,\quad A91=\hat{A}40*\hat{A}41*\hat{A}42*A43,$$

$$A92=\hat{A}40*\hat{A}41*A42*\hat{A}43,\quad A93=\hat{A}40*\hat{A}41*\hat{A}42*A43,$$

where A40, A41, A42, A43 are the comparator output signals from the output terminals 40, 41, 42 and 43, Â40, Â41, Â42 and Â43 are the inverted comparator output signals from the inverter stages 80, 81, 82 and 83 and A90, A91, A92 and A93 are the signals at the outputs of the AND gates 90, 91, 92 and 93, and * designates the logic AND operation.

In OR gates 100 and 101 connected on the output side to the AND gates 90 and 91 and 92 and 93, respectively, in each case two of the signals at the outputs of the AND gates 90, 91, 92 and 93 are linked to one another to form the individual digits of the m-digit binary signal. In FIG. 3 there are two OR gates for two digits A110 and A111 of a two-digit binary signal. The rules for this are as follows:

$$A110=A90+A91,\quad A111=A92+A93,$$

where + designates the logic OR operation.

This arrangement too can be expanded as desired, as shown in FIG. 3 by the switching elements shown in dashed line—fifth two-terminal resistor 5 with sixth connection point 15 and fifth comparator stage 24 with input terminals 38 and 39 and output terminal 44.

LIST OF REFERENCES

1 first two-terminal resistor
2 second two-terminal resistor
3 third two-terminal resistor
4 fourth two-terminal resistor
5 fifth two-terminal resistor
6 sixth two-terminal resistor
7 seventh two-terminal resistor
8 eighth two-terminal resistor
9 ninth two-terminal resistor
10 first connection point
11 second connection point
12 third connection point
13 fourth connection point
14 fifth connection point
15 sixth connection point
16 seventh connection point
17 eighth connection point
18 ninth connection point
19 tenth connection point
20 first comparator stage
21 second comparator stage
22 third comparator stage
23 fourth comparator stage
24 fifth comparator stage
30 first input terminal of 20
31 second input terminal of 20
32 first input terminal of 21
33 second input terminal of 21
34 first input terminal of 22
35 second input terminal of 22
36 first input terminal of 23
37 second input terminal of 23
38 first input terminal of 24
39 second input terminal of 24
40 output terminal of 20 for comparator output signal A40
41 output terminal of 21 for comparator output signal A41
42 output terminal of 22 for comparator output signal A42
43 output terminal of 23 for comparator output signal A43
44 output terminal of 24
50 switching stage
51 first input terminal of 50
52 second input terminal of 50
53 third input terminal of 50
54 fourth input terminal of 50
55 fifth input terminal of 50
60 AND gate
70 output terminal of 60
80 first inverter stage of 50, supplies inverted comparator output signal Â40
81 second inverter stage of 50, supplies inverted comparator output signal Â41
82 third inverter stage of 50, supplies inverted comparator output signal Â42
83 fourth inverter stage of 50, supplies inverted comparator output signal Â43
90 AND gate
91 AND gate
92 AND gate
93 AND gate
100 OR gate
101 OR gate
110 output terminal of 50 and 100 for m-digit binary signal
111 output terminal of 50 and 101 for m-digit binary signal

The invention claimed is:

1. A circuit arrangement with a resistor voltage divider chain which comprises a number N of two-terminal resistors which are connected in series between a number N+1 of connection points, with N being greater than or equal to 2, characterized by an arrangement for monitoring the operating state having at least two comparator stages with in each case two input terminals, each of which is connected to in each case one of the connection points such that each of the resistor elements is bridged by the input terminals of at most one of the comparator stages, and with in each case one output terminal for outputting a comparator output signal having a first logic level when corresponding signals are fed to the input terminals and otherwise having a second logic level, and a switching stage which has in each case one input terminal for connection to each of the output terminals of the comparator stages and is designed to form an error signal by logic switching of the comparator output signals in order to indicate an error when at least one of the comparator output signals has a first logic level.

2. A circuit arrangement as claimed in claim 1, characterized in that the switching stage comprises an AND gate.

3. A circuit arrangement as claimed in claim 1, characterized in that the switching stage is designed to output a signal which contains information about which of the comparator output signals assume(s) the first or the second logic level.

4. A circuit arrangement comprising:

a resistor voltage divider chain including at least two two-terminal resistors connected in series between a number of connection points;

at least two comparators, each having two input terminals and one output terminal, each of the input terminals connected to a connection point via which the comparator bridges a single resistor, the comparator adapted to output a signal having a first logic level in response to a discontinuity in a portion of the resistor voltage divider chain not bridged by the comparator, and to otherwise output a second logic level; and a switch having an input terminal connected to each of the output terminals of the comparators and adapted to provide an error signal indicating a discontinuity in a bridged resistor in response to one of the comparator output signals having the first logic level.

5. A circuit arrangement for detecting a break in a resistor voltage divider chain comprising N two-terminal resistors connected in series between N+1 connection points, with N being greater than or equal to 2, the circuit arrangement comprising:

at least two comparator stages, each comparator stage including two input terminals, each of which is connected to one of the connection points such that each of the resistors is bridged by the input terminals of at most one of the comparator stages, and one output terminal for outputting a comparator output signal having a first logic level when corresponding signals are fed to the input terminals and otherwise having a second logic level;

a switching stage having one input terminal connected to each of the output terminals of the comparator stages, adapted to form an error signal by logic switching of the comparator output signals to indicate an error when at least one of the comparator output signals has a first logic level, and adapted to output a signal that includes information about which of the comparator output signals is of the first or the second logic level.

6. The circuit arrangement or claim 5, wherein each two-terminal resistor is bridged by the input terminals of one of the comparator stages.

7. The circuit arrangement or claim 5, wherein each two-terminal resistor is bridged by the input terminals of one of the comparator stages and a location of a break in the resistor voltage divider chain is identified by the comparator output signal that is of the second logic level.

* * * * *